(12) United States Patent
Deng et al.

(10) Patent No.: US 12,058,803 B2
(45) Date of Patent: Aug. 6, 2024

(54) CIRCUIT BOARD ASSEMBLY AND ELECTRONIC DEVICE

(71) Applicant: HUAWEI TECHNOLOGIES CO., LTD., Guangdong (CN)

(72) Inventors: Chaojun Deng, Dongguan (CN); Fei Ma, Dongguan (CN); Wei Fang, Shenzhen (CN); Zhiwen Yang, Dongguan (CN); Chungang Li, Dongguan (CN); Shun Hao, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 18/372,828

(22) Filed: Sep. 26, 2023

(65) Prior Publication Data

US 2024/0107656 A1 Mar. 28, 2024

Related U.S. Application Data

(63) Continuation of application No. 17/155,324, filed on Jan. 22, 2021, now Pat. No. 11,805,592, which is a (Continued)

(30) Foreign Application Priority Data

Jul. 23, 2018 (CN) .......................... 201810809693.7

(51) Int. Cl.
H05K 7/20 (2006.01)
G02B 6/42 (2006.01)
(Continued)

(52) U.S. Cl.
CPC ......... *H05K 1/0203* (2013.01); *G02B 6/4269* (2013.01); *G02B 6/4284* (2013.01);
(Continued)

(58) Field of Classification Search
None
See application file for complete search history.

(56) References Cited

U.S. PATENT DOCUMENTS 5,947,764 A 9/1999 Pan et al.
7,667,311 B2 * 2/2010 Furuyama ............ G02B 6/4269
257/E23.141
(Continued)

FOREIGN PATENT DOCUMENTS

CN 101995907 A 3/2011
CN 202816379 U 3/2013
(Continued)

*Primary Examiner* — Courtney L Smith
(74) *Attorney, Agent, or Firm* — WOMBLE BOND DICKINSON (US) LLP

(57) ABSTRACT

A circuit board assembly is applied to the field of electronic communications technologies to resolve a prior-art heat dissipation problem of a circuit board. The circuit board assembly combines, on a second circuit board, low-speed signals transmitted between a plurality of I/O modules and an IC chip, and then transmits the combined low-speed signals to the IC chip by using a low-speed cable. A low-speed signal sent by the IC chip to the plurality of I/O modules is extended to a plurality of low-speed signals on the second circuit board, and then the plurality of low-speed signals are separately sent to the plurality of I/O modules. This may be applied to a scenario in which a relatively large quantity of electronic components need to be disposed on a circuit board.

10 Claims, 9 Drawing Sheets

Related U.S. Application Data continuation of application No. PCT/CN2019/095588, filed on Jul. 11, 2019.

(51) Int. Cl.
    *H05K 1/02*         (2006.01)
    *H05K 1/18*         (2006.01)
    *H05K 7/02*         (2006.01)

(52) U.S. Cl.
    CPC ............. *H05K 1/181* (2013.01); *H05K 7/023* (2013.01); *H05K 7/026* (2013.01); *H05K 7/20409* (2013.01)

(56) References Cited

U.S. PATENT DOCUMENTS

| | | |
|---|---|---|
| 8,772,704 B2 | 7/2014 | Mack et al. |
| 9,638,876 B2 | 5/2017 | Schamuhn et al. |
| 10,048,439 B1 | 8/2018 | Dutta |
| 11,385,426 B2 | 7/2022 | Bechtolsheim et al. |
| 2002/0065971 A1 | 5/2002 | Farnworth et al. |
| 2006/0109631 A1 | 5/2006 | Marro et al. |
| 2014/0270629 A1 | 9/2014 | Dutt et al. |
| 2015/0028908 A1* | 1/2015 | Kushnick ............ G06F 11/2221 324/750.05 |
| 2016/0071818 A1 | 3/2016 | Wang et al. |
| 2020/0066641 A1 | 2/2020 | Aygun et al. |

FOREIGN PATENT DOCUMENTS

| | | |
|---|---|---|
| CN | 103168396 A | 6/2013 |
| CN | 103676033 A | 3/2014 |
| CN | 103681617 A | 3/2014 |
| CN | 106353860 A | 1/2017 |
| CN | 107112750 A | 8/2017 |
| CN | 107534029 A | 1/2018 |
| CN | 108008764 A | 5/2018 |
| DE | 202009003712 U1 | 6/2009 |
| EP | 3013130 A1 | 4/2016 |
| WO | 2002054847 A2 | 7/2002 |
| WO | 2013006499 A2 | 1/2013 |
| WO | 2017019083 A1 | 2/2017 |

* cited by examiner

CIRCUIT BOARD ASSEMBLY AND ELECTRONIC DEVICE

CROSS-REFERENCE TO RELATED APPLICATIONS

This application is a continuation of U.S. patent application Ser. No. 17/155,324, filed on Jan. 22, 2021, which is a continuation of International Application No. PCT/CN2019/095588, filed on Jul. 11, 2019, which claims priority to Chinese Patent Application No. 201810809693.7, filed on Jul. 23, 2018. All of the afore-mentioned patent applications are hereby incorporated by reference in their entireties.

TECHNICAL FIELD

This disclosure relates to the field of electronic technologies and the field of communications technologies, and in particular, to a circuit board interconnection technology.

BACKGROUND

A circuit board is usually provided with many components, and heat dissipated by these components in a working process needs to be conducted or dissipated in time. Currently, with an increase in layout density of the components, a heat dissipation problem becomes increasingly difficult to be resolved.

SUMMARY

In view of this, embodiments of this disclosure provide a circuit board assembly, to resolve a prior-art heat dissipation problem of a circuit board to some extent.

According to a first aspect, this disclosure provides an embodiment of a circuit board assembly. The circuit board assembly includes a first circuit board, a second circuit board, one or more low-speed cables, a plurality of high-speed cables, an IC (integrated circuit) chip, and a plurality of I/O (input/output) modules. The IC chip is installed on the first circuit board, and the plurality of I/O modules are installed on the second circuit board. Low-speed signals and high-speed signals that are transmitted between the plurality of I/O modules and the IC chip are transmitted on different channels, and the high-speed signals are transmitted by using the plurality of high-speed cables. The low-speed signals are combined on the second circuit board, and then the combined low-speed signals are transmitted to the IC chip by using the low-speed cable. A low-speed signal sent by the IC chip to the plurality of I/O modules is extended to a plurality of low-speed signals on the second circuit board, and then the plurality of low-speed signals are separately sent to the plurality of I/O modules.

In this way, low-speed signals transmitted between the plurality of I/O modules and the IC chip are combined, and then the combined low-speed signals are transmitted by using a small quantity of low-speed cables. To be specific, only a small quantity of low-speed cables that connect the first circuit board and the second circuit board, and the small quantity of low-speed cables occupy extremely small space, so that more space can be reserved for heat dissipation and airflow ventilation, to help to dissipate heat.

In an embodiment, the circuit board assembly further includes a monitoring module, the monitoring module is installed on the second circuit board, and the IC chip is connected to the monitoring module by using the low-speed cable, the monitoring module is connected to a plurality of I/O modules by using an intra-board cable, and the monitoring module is configured to extend one low-speed signal received from the low-speed cable into a plurality of low-speed signals, and correspondingly send a plurality of low-speed signals to a plurality of I/O modules, and is configured to correspondingly send low-speed signals from a plurality of I/O modules; and after the aggregation, the aggregation data is sent to the IC chip 11 by using the low-speed cable. In this way, low-speed signals transmitted between a plurality of I/O (input/output, input/output) modules and an IC (integrated circuit, integrated circuit) chip are expanded and combined by using the monitoring module.

In an embodiment, the circuit board assembly further includes a chip heat sink and a plurality of high-speed connectors, and a plurality of high-speed connectors are installed on the first circuit board, each I/O module is connected to the high-speed connector of the first circuit board 1 by using one or more high-speed cables, and the high-speed connector is connected to the IC chip by using an intra-board cable of the first circuit board, and the chip heat sink is attached to a surface of the IC chip; and the plurality of high-speed connectors and the IC chip are located on a same side surface of the first circuit board, a part or an entirety of the plurality of high-speed connectors and the IC chip are disposed in a projection area of the chip heat sink on the first circuit board. Alternatively, the high-speed connector is disposed on a rear side of the first circuit board, namely, a side opposite to a side on which the IC chip is located. A plane parallel to a front side of the first circuit board is used as a reference plane, a plane parallel to a rear side of the first circuit board is used as a reference plane, or a plane perpendicular to a thickness direction of the first circuit board is used as a reference plane. A projection of the high-speed connector on the reference plane partially or completely falls within a projection of the chip heat sink on the reference plane.

A part or an entirety of the high-speed connector is disposed in a projection area of the chip heat sink 12 in the first circuit board or the reference plane. In this way, the high-speed connector is very close to the IC chip and a high-speed signal is transmitted between the high-speed connector and the IC chip. Because a transmission distance on the first circuit board is very short, attenuation is not very large, and a quality requirement of a high-speed system for SI (Signal Integrity) can be met. In this way, a requirement for signal transmission performance of the first circuit board is relatively low, and costs of the first circuit board are also relatively low.

In addition, because a part or an entirety of the high-speed connector is disposed in a projection area of the chip heat sink on the first circuit board or the reference plane, the high-speed connector no longer additionally occupies too many other areas, so that the area on the surface of the first circuit board is fully utilized, and utilization of the surface of the first circuit board is improved.

In an embodiment, a quantity of I/O modules installed on the second circuit board may be two or more, a quantity of the low-speed cables is less than a quantity of the I/O modules.

In an embodiment, the circuit board assembly further includes a first low-speed connector and a second low-speed connector, and the first low-speed connector is installed on the first circuit board, the second low-speed connector is installed on the second circuit board, the first low-speed connector is connected to the second low-speed connector by using the low-speed cable, the first low-speed connector is connected to the IC chip by using an intra-board cable, and the second low-speed connector is connected to the monitoring module by using an intra-board cable. The monitoring module is connected to the I/O module by using an intra-board cable.

In an embodiment, the monitoring module may be an integrated circuit operating according to a non-fixed instruction or an integrated circuit operating according to a fixed instruction. For example, the monitoring module may be a CPLD (complex programmable logic device) chip.

In an embodiment, a low-speed signal transmitted between the IC chip and the I/O module may include a monitoring-type signal, the monitoring-type signal includes a monitoring-type signal sent by the IC chip to the I/O module, for example, a reset signal, a low power mode setting signal, an enabling signal, or the like.

The monitoring-type signal may further include a monitoring-type signal sent by the I/O module to the IC chip, for example, an optical module in-position signal, an optical module error reporting signal, an interrupt signal of an optical module, or the like.

In an embodiment, the low-speed signal transmitted between the IC chip and the I/O module may include management service data.

In an embodiment, the circuit board assembly further includes one or more power cables, and the power cables are connected between the first circuit board and the second circuit board, which is configured to output the electric energy in the intra-board power cable of the first circuit board to the intra-board power cable of the second circuit board, so that a plurality of I/O modules obtain the electric energy from the intra-board power cable of the second circuit board.

In an embodiment, the I/O module may be fastened to the second circuit board in a crimping manner, and the I/O modules may be connected to both front and rear sides of the second circuit board in a crimping manner, to improve layout density of the I/O modules.

In an embodiment, a plane parallel to the front side of the second circuit board is used as a reference plane, a plane parallel to a rear side of the second circuit board is used as a reference plane; or a plane perpendicular to a thickness direction of the second circuit board is used as a reference plane. Projections of areas in which the I/O modules are connected to both front and rear sides of a same part of the second circuit board in a crimping manner on the reference plane overlap or mostly overlap.

In an embodiment, cable-side connectors are disposed at two ends of the high-speed cable, and a cable-side connector at one end is connected to a tail end of the I/O module, and the cable-side connector on the other end of the high-speed cable cooperates with the high-speed connector on the first circuit board. The high-speed connectors of the first circuit board are disposed in one column, and cable-side connectors of two high-speed cables connected to two I/O modules connected to both front and rear sides of a same part of the second circuit board in a crimping manner are connected to two adjacent high-speed connectors of the first circuit board in a one-to-one correspondence.

In an embodiment, a signal pin is disposed at the bottom of the cable-side connector, and the signal pins are installed on the second circuit board and are connected to an intra-board cable of the second circuit board, and the conductive terminals in the cable-side connector include a first group of terminals and a second group of terminals. The first group of terminals are configured to transmit the high-speed signal, and the second group of terminals are configured to transmit the low-speed signal; and ends of the first group of terminals are connected to the I/O module or an optical module in the I/O module, and the other ends of the first group of terminals are connected to a conducting wire in the high-speed cable; and ends of the second group of terminals are connected to the I/O module or an optical module in the I/O module, and the other ends of the second group of terminals are connected to the signal pin.

In an embodiment, a high-speed cable in a flat form is bundled into a cylindrical form. High-speed cables connecting an I/O module on a front side and an I/O module on a rear side of a same part of the second circuit board are disposed in a stacked manner in a height direction.

In this overlapping cabling solution, wind resistance is reduced, and heat dissipation performance of a system is improved, to help heat dissipation of an optical module.

In an embodiment, the circuit board assembly further includes a first power connector, the first power connector is installed on the first circuit board, and the first circuit board is connected to the first low-speed connector of the low-speed cable. A first power connector connected to the power cable is located in an edge position of the first circuit board.

In an embodiment, the circuit board assembly further includes a second power connector, the first power connector is installed on the second circuit board, and the second circuit board is connected to the second low-speed connector of the low-speed cable. A second power connector connected to the power cable is located in an edge position of the second circuit board.

According to a second aspect, this disclosure provides another embodiment of a circuit board assembly. The circuit board assembly includes a first circuit board, an IC (integrated circuit) chip, a chip heat sink, and a high-speed connector. The IC chip is installed on the first circuit board, and the chip heat sink is attached to a surface of the IC chip, the high-speed connector and the IC chip are located on a same side surface of the first circuit board, a part or an entirety of the high-speed connector and the IC chip are disposed in a projection area of the chip heat sink on the first circuit board; the high-speed connector is connected to the IC (integrated circuit, integrated circuit) chip by using an intra-board cable located on the first circuit board, or the high-speed connector is disposed on a rear side of the first circuit board, namely, a side opposite to a side on which the IC chip is located. A plane parallel to a front side of the first circuit board is used as a reference plane, a plane parallel to a rear side of the first circuit board is used as a reference plane, or a plane perpendicular to a thickness direction of the first circuit board is used as a reference plane. A projection of the high-speed connector on the reference plane partially or completely falls within a projection of the chip heat sink on the reference plane.

Because a part or an entirety of the high-speed connector is disposed in a projection area of the chip heat sink on the first circuit board or the reference plane, the high-speed connector no longer additionally occupies too many other areas, so that the area on the surface of the first circuit board is fully utilized, and utilization of the surface of the first circuit board is improved.

In an embodiment, an intra-board cable that is of the first circuit board and that connects the high-speed connector to the IC chip is configured to transmit a high-speed signal.

A part or an entirety of the high-speed connector is disposed in a projection area of the chip heat sink on the first circuit board or the reference plane. In this way, the high-speed connector is very close to the IC chip and a high-speed signal is transmitted between the high-speed connector and the IC chip. Because a transmission distance on the first circuit board 1 is very short, attenuation is not very large, and a quality requirement of a high-speed system for SI (Signal Integrity) can be met. In this way, a requirement for signal transmission performance of the first circuit board is relatively low, and costs of the first circuit board are also relatively low.

In an embodiment, the circuit board assembly further includes a high-speed cable, where the high-speed cable is connected to the high-speed connector. The high-speed cable is configured to transmit a high-speed signal.

In an embodiment, the circuit board assembly further includes a first low-speed connector, the first low-speed connector is installed on the first circuit board, and the low-speed connector is connected to the IC chip by using an intra-board cable of the first circuit board.

In an embodiment, the circuit board assembly further includes one or more low-speed cables, the low-speed cables cooperate with the first low-speed connector, and the low-speed cable is configured to transmit a low-speed signal.

In an embodiment, the low-speed signal may include a monitoring-type signal, for example, a reset signal, a low power mode setting signal, an enabling signal, an optical module in-position signal, an optical module error reporting signal, an interrupt signal of an optical module, or the like.

In an embodiment, the low-speed signal may include management service data.

In an embodiment, the circuit board assembly further includes a first power connector, and the first power connector is installed on the first circuit board.

In an embodiment, the circuit board assembly further includes one or more power cables, and the power cables cooperate with the first power connector, and the power cable is configured to transmit electric energy.

In an embodiment, a quantity of the high-speed connectors is a plurality of, and a quantity of the high-speed cables is correspondingly a plurality of A plurality of high-speed connectors are positioned in rows.

In an embodiment, a cable-side connector is disposed at an end of the high-speed cable, and the cable-side connector cooperates with the high-speed connector.

In an embodiment, a high-speed cable in a flat form is bundled into a cylindrical form.

In an embodiment, the circuit board assembly further includes a first power connector, where the first power connector is installed on the first circuit board, and on the first circuit board 1, a first low-speed connector connected to the low-speed cable and a first power connector connected to the power cable are located in an edge position of the first circuit board.

According to a third aspect, this disclosure further provides an embodiment of a circuit board assembly. The circuit board assembly includes a second circuit board, a monitoring module, and a plurality of I/O (input/output) modules. The monitoring module and the plurality of I/O modules are installed on the second circuit board, and the monitoring module is connected to the plurality of I/O modules by using an intra-board cable. The monitoring module is configured to: extend one received low-speed signal into a plurality of low-speed signals, and correspondingly send the plurality of low-speed signals to the plurality of I/O modules; and is configured to: combine low-speed signals from the plurality of I/O modules, and then output the combined low-speed signals.

In this way, the monitoring module extends low-speed signals that are input to the plurality of I/O modules, and combines low-speed signals that are output by the plurality of I/O (input/output, input/output) modules. The low-speed signals used for communication between the plurality of I/O modules and the outside are transmitted only by using a small quantity of low-speed cables, and the small quantity of low-speed cables occupy extremely small space, so that more space can be reserved for heat dissipation and airflow ventilation, to help to dissipate heat.

In an embodiment, the circuit board assembly further includes one or more low-speed cables, and the low-speed cable is connected to the monitoring module, the monitoring module is configured to receive the one low-speed signal from the low-speed cable, and is configured to output the combined low-speed signal to the low-speed cable.

In an embodiment, a quantity of I/O modules installed on the second circuit board may be two or more, a quantity of the low-speed cables is less than a quantity of the I/O modules.

In an embodiment, the circuit board assembly further includes a second low-speed connector, and the second low-speed connector is installed on the second circuit board, the second low-speed connector is installed on the second circuit board, the second low-speed connector is connected to the low-speed cable, and the second low-speed connector is connected to the monitoring module by using an intra-board cable. The monitoring module is connected to the I/O module through an intra-board cable.

In an embodiment, the monitoring module may be an integrated circuit operating according to a non-fixed instruction or an integrated circuit operating according to a fixed instruction. For example, the monitoring module may be a CPLD (complex programmable logic device) chip.

The following describes a specific implementation. The implementation may be combined with any one of the foregoing implementations. In the specific implementation, in the foregoing embodiment of this disclosure, the low-speed signal may include the monitoring-type signal, and the monitoring-type signal includes the reset signal, the low power mode setting signal, the enabling signal, or the like.

The monitoring-type signal may further include an optical module in-position signal, an optical module error reporting signal, an interrupt signal of the optical module, and the like.

In an embodiment, the low-speed signal may include management service data.

In an embodiment, the circuit board assembly further includes one or more power cables, and the power cables power cable are connected to the intra-board power cable of the second circuit board.

The power cable may transmit electric energy to an intra-board power cable of the second circuit board. In this way, the plurality of I/O modules may obtain the electric energy from the intra-board power cable of the second circuit board.

In an embodiment, the I/O module may be fastened to the second circuit board in a crimping manner, and the I/O modules may be connected to both front and rear sides of the second circuit board in a crimping manner, to improve layout density of the I/O modules.

In an embodiment, a plane parallel to the front side of the second circuit board is used as a reference plane, a plane parallel to a rear side of the second circuit board is used as a reference plane, or a plane perpendicular to a thickness direction of the second circuit board is used as a reference plane. Projections of areas in which the I/O modules are connected to both front and rear sides of a same part of the second circuit board in a crimping manner on the reference plane overlap or mostly overlap.

In an embodiment, the circuit board assembly further includes a high-speed cable, where the plurality of high-speed cables are connected in a one-to-one correspondence with the I/O modules, and the high-speed cables are connected at the tail end of the I/O module.

Cable-side connectors are provided at both ends of the high-speed cable, and the cable-side connector at one end is connected to the tail end of the I/O module.

In an embodiment, a signal pin is disposed at the bottom of the cable-side connector, and the signal pins are installed on the second circuit board and are connected to an intra-board cable of the second circuit board, and the conductive terminals in the cable-side connector include a first group of terminals and a second group of terminals. The first group of terminals are configured to transmit the high-speed signal, and the second group of terminals are configured to transmit the low-speed signal; and ends of the first group of terminals are connected to the I/O module or an optical module in the I/O module, and the other ends of the first group of terminals are connected to a conducting wire in the high-speed cable; and ends of the second group of terminals are connected to the I/O module or an optical module in the I/O module, and the other ends of the second group of terminals are connected to the signal pin.

In an embodiment, a high-speed cable in a flat form is bundled into a cylindrical form. High-speed cables connecting an I/O module on a front side and a rear side of a same part of the second circuit board are disposed in a stacked manner in a height direction.

In this overlapping cabling solution, wind resistance is reduced, and heat dissipation performance of a system is improved, to help heat dissipation of an optical module.

In an embodiment, the circuit board assembly further includes a second power connector, the second power connector is installed on the second circuit board, and the second power connector is connected to the power cable. The second low-speed connector and the second power connector are located in an edge position of the second circuit board.

According to a fourth aspect, this disclosure further provides an embodiment of an electronic device. The electronic device includes a plurality of circuit board assemblies, a housing, and a heat dissipation apparatus. The circuit board assemblies are installed inside the housing, and the heat dissipation apparatus is configured to dissipate heat for the circuit board assemblies. The circuit board assembly may be implemented in the various implementations of the first aspect, the second aspect, or the third aspect.

Figure 1:
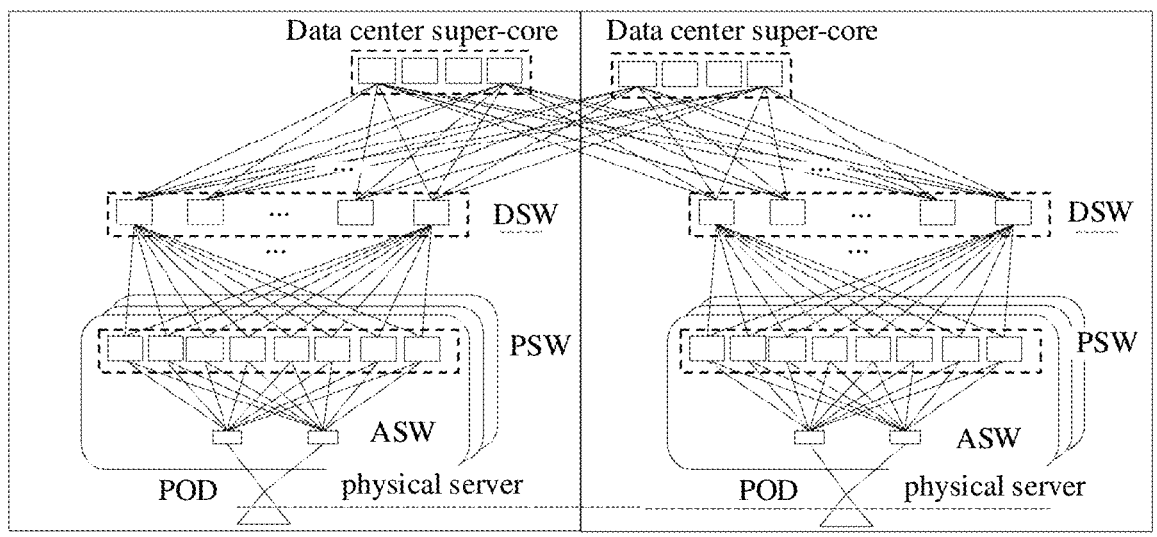
FIG. 1 is a topology diagram of a cloud data center network.

Components symbol description: a first circuit board 1, an IC chip 11, a chip heat-sink 12, a high-speed connector 13, a first low-speed connector 14, a first power connector 15, a second circuit board 2, an I/O module 21, a monitoring module 22, a second low-speed connector 24, a second power connector 25, a low-speed cable 3, a high-speed cable 4, a cable-side connector 41, a power cable 5, a heat sink 211, a heat dissipation panel 212, a signal pin 213, a port panel 214, a baseplate 8, a circuit board assembly 01, a housing 02; a slot 03, and a cable support 9.

DESCRIPTION OF EMBODIMENTS

At present, in a network with a relatively high data transmission rate, for example, an optical transport network, a cloud data center network, an enterprise network, or the like, due to relatively high device density and a relatively large amount of to-be-processed data, much heat is generated, and therefore a requirement for heat dissipation efficiency of devices in the network is relatively high. These devices generally include switches, routers, or the like.

A cloud data center network shown in FIG. 1 is used as an example. The cloud data center network includes an ASW (access switch), a PSW (POD switch or node switch), a DSW (distributed switch), and a data center super core. The ASW is located at the access layer, the PSW is located at the convergence layer, and the DSW is located at the core layer. The ASW is used to implement server access. The PSW is used to implement interconnection between switches in a POD (node). The DSW is used to implement interconnection between switches in the POD. The data center super core is configured to implement interconnection between data centers in different areas. A data transmission rate between interconnected devices is usually 100 Gbps, and such a high data transmission rate enables devices such as a data center switch and a DSW that are located at a super core of a data center to have a relatively high requirement on heat dissipation efficiency.

For the devices such as the switches or the routers, the solutions in the following embodiments may be used to improve heat dissipation efficiency. It should be noted that the solutions in the following embodiments may also be used for another electronic device having a relatively high requirement for heat dissipation efficiency.

Figure 2:
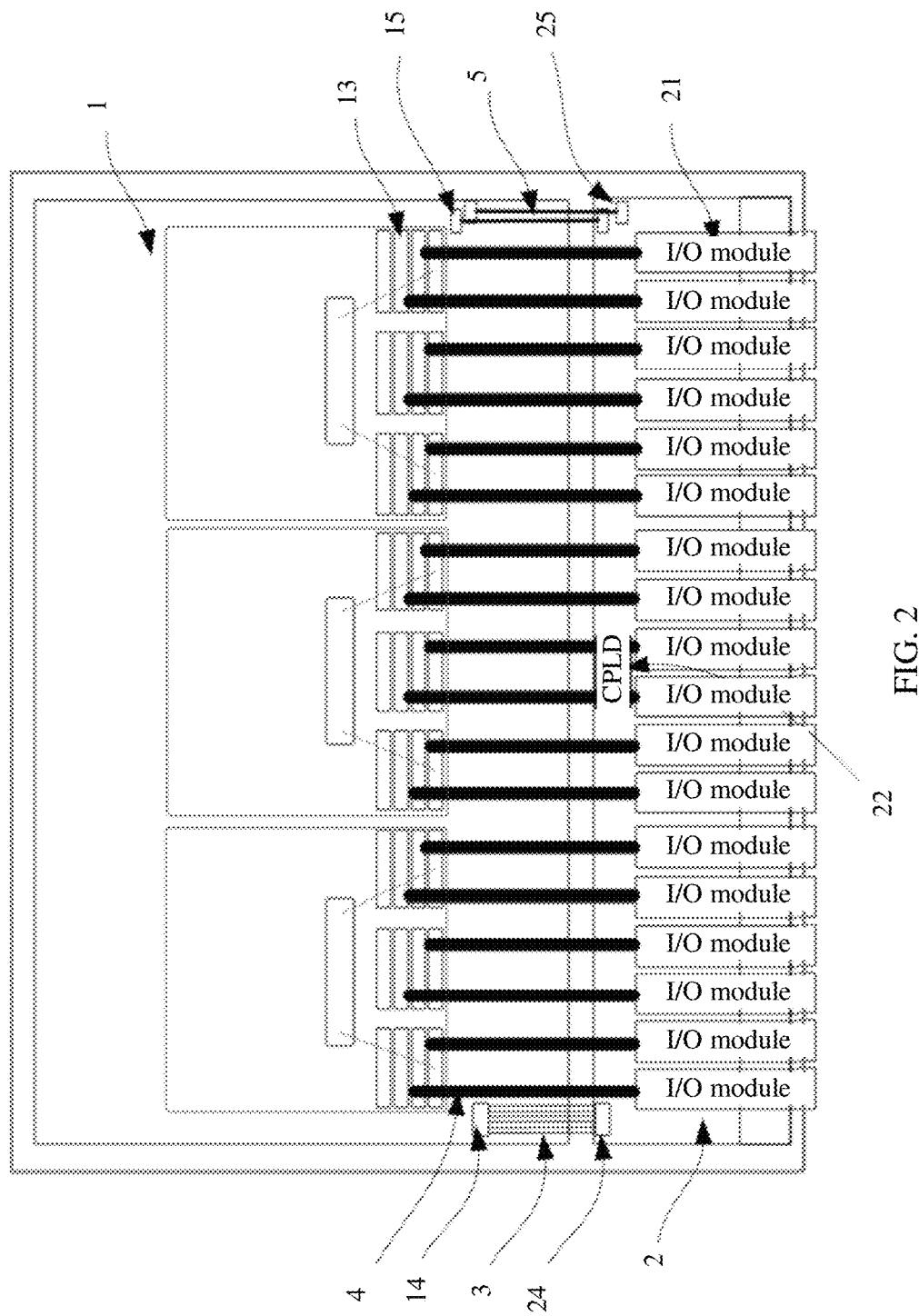
FIG. 2 is a schematic top view of a layout of each component in the embodiment of a circuit board assembly in this disclosure.
Figure 3:
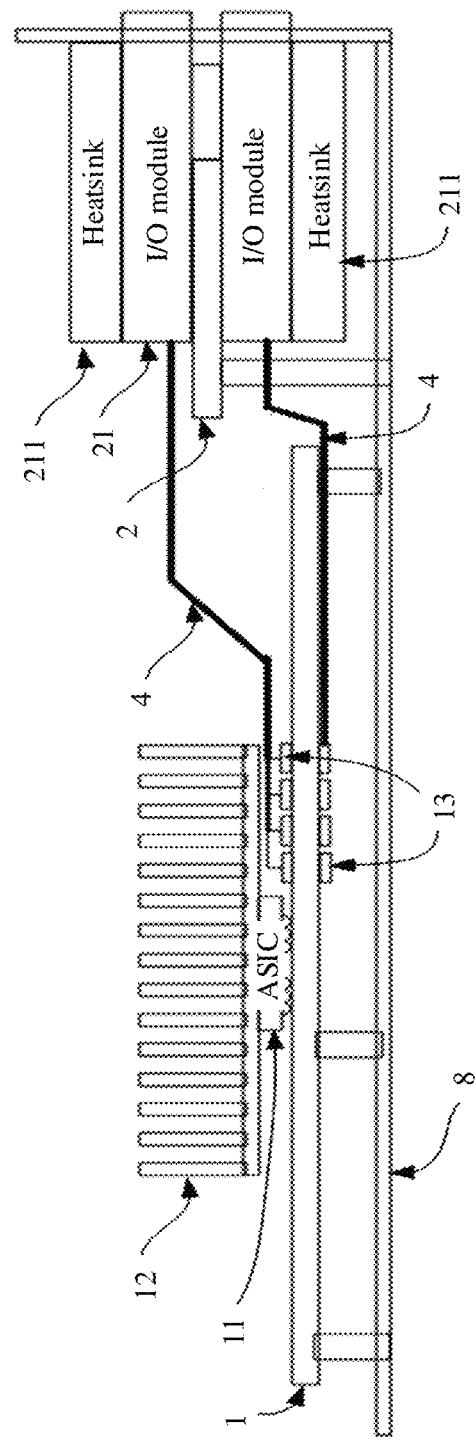
FIG. 3 is a schematic side view of a layout status of components in the embodiment of a circuit board assembly in this disclosure.

Referring to FIG. 2 and FIG. 3, this disclosure provides an embodiment of a circuit board assembly. The circuit board assembly includes a first circuit board 1, a second circuit board 2, one or more low-speed cables 3, a plurality of high-speed cables 4, an IC chip 11, and a chip heat sink 12, a plurality of high-speed connectors 13, a plurality of I/O (input/output) modules 21, a monitoring module 22, the IC chip 11, and the high-speed connector 13 are installed on the first circuit board 1, the plurality of I/O modules 21, and the monitoring module 22 are installed on the second circuit board 2, the IC chip 11 is connected to the monitoring module 22 by using the low-speed cable 3, the monitoring module 22 is connected to a plurality of I/O modules 21 by using an intra-board cable, and the monitoring module 22 is configured to: extend one low-speed signal received from the low-speed cable 3 into a plurality of low-speed signals, and correspondingly send the plurality of low-speed signals to the plurality of I/O modules 21; and is configured to: combine low-speed signals from the plurality of I/O modules 21, and then send the combined low-speed signals to the IC chip 11 by using the low-speed cable 3. Each I/O module 21 is connected to the high-speed connector 13 of the first circuit board 1 by using one or more high-speed cables 4. The high-speed connector 13 is connected to the IC chip 11 by using an intra-board cable of the first circuit board 1. The chip heat sink 12 is attached to a surface of the IC chip 11, the plurality of high-speed connectors 13 and the IC chip 11 are located on a same side surface of the first circuit board 1, and a part or an entirety of the plurality of high-speed connectors 13 and the IC chip 11 are disposed in a projection area of the chip heat sink 12 in the first circuit board 1.

In an embodiment of this disclosure, a high-speed signal between the IC chip 11 and the I/O module 21 is transmitted by using the high-speed cable 4, and a low-speed signal between the IC chip 11 and the I/O module 21 is transmitted by using the monitoring module 22 and the low-speed cable 3. Low-speed signals from a plurality of I/O modules 21 are merged by the monitoring module 22, and therefore, are sent to the IC chip 11 by using a small quantity of low-speed cables 3, or even may be sent to the IC chip 11 by using only one low-speed cable 3. Correspondingly, the low-speed signal from the IC chip 11 is also sent to a plurality of I/O modules 21 after being extended by the monitoring module 22. Therefore, there are a relatively small quantity of cables between the first circuit board 1 and the second circuit board 2. In this way, some space for airflow ventilation can be reserved, to help heat dissipation of the circuit board assembly.

In an embodiment of this disclosure, the chip heat sink 12 is attached to a surface of the IC chip 11 may be the chip heat sink 12 is in direct contact with the IC chip 11. Alternatively, the chip heat sink 12 is in contact with the IC chip 11 by using a thermally conductive medium. The chip heat sink 12 is configured to dissipate heat for the IC chip, and heat generated by the IC chip 11 is directly conducted to the chip heat sink 12 or is conducted to the chip heat sink 12 by using a thermally conductive medium.

Figure 5:
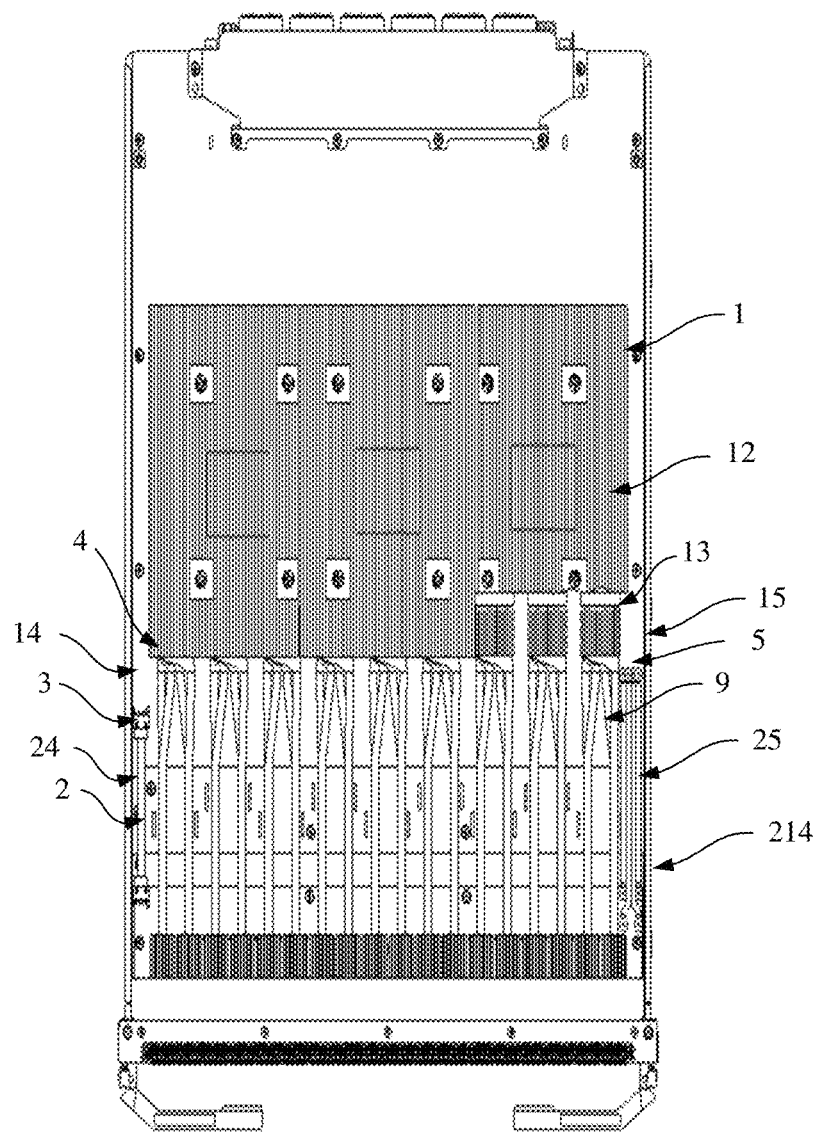
FIG. 5 is a schematic structural diagram of a layout status of components in the embodiment of a circuit board assembly in this disclosure.

As shown in FIG. 3 and FIG. 5, in the foregoing embodiments of this disclosure, the bottom surface of the chip heat sink 12 generally directly abuts against or abuts against the top surface of the IC chip 11 by using a thermally conductive medium, to facilitate heat generated by the IC chip 11 to the chip heat sink 12. To dissipate heat for the IC chip 11 more efficiently, the chip heat sink 12 is generally large, and correspondingly, a bottom surface of the chip heat sink 12 is also set to be large. The bottom surface of the chip heat sink 12 will be larger than the top surface of the IC chip 11 so that a part of the bottom surface of the chip heat sink 12 is covered on the top surface of the IC chip 11, and a part of the bottom surface of the chip heat sink 12 protrudes from the top surface of the IC chip 11. For example, an edge position of the bottom surface of the chip heat sink 12 protrudes out of the top surface of the IC chip 11. In this way, a space between the surface of the first circuit board 1 and the bottom surface of the chip heat sink 12 may be used to accommodate all or a part of the high-speed connector 13. It should be noted that FIG. 5 is a top view of FIG. 6. FIG. 7 is an exploded view of a circuit board assembly shown in FIG. 5 and FIG. 6. It can be found from FIG. 7 that, three IC chips 11 and three chip heat sinks 12 are disposed on the first circuit board 1. In FIG. 5, the right-most chip heat sink 12 is partially cut off to see clearly the high-speed connector 13 covered by the chip heat sink 12.

As shown in FIG. 3 and FIG. 5, a part or an entirety of the high-speed connector 13 and the IC clip 11 are disposed in a projection area of the chip heat sink 12 in the first circuit board 1. In this way, the high-speed connector 13 is very close to the IC chip 11 and a high-speed signal is transmitted between the high-speed connector 13 and the IC chip 11. Because a transmission distance on the first circuit board 1 is very short, attenuation is not very large, and a quality requirement of a high-speed system for SI (Signal Integrity, Signal Integrity) can be met. In this way, a requirement for signal transmission performance of the first circuit board is relatively low, and costs of the first circuit board are also relatively low.

In addition, because a part or an entirety of the high-speed connector 13 is disposed in the projection area of the chip heat sink 12 on the first circuit board 1, and the high-speed connector 13 no longer additionally occupies too many other areas on the first circuit board 1, so that the area on the surface of the first circuit board 1 is fully utilized, and utilization of the surface of the first circuit board 1 is improved.

In an embodiment of this disclosure, that the part or an entirety of a plurality of high-speed connectors 13 and the IC chip 11 are disposed in the projection area of the chip heat sink 12 on the first circuit board 1 may be that a part or an entirety of a part of the high-speed connectors 13 in a plurality of high-speed connectors 13 may be disposed, the IC chip 11 is disposed in a projection area of the chip heat sink 12 on the first circuit board 1. Alternatively, a part or an entirety of all the high-speed connectors 13 in a plurality of high-speed connectors 13, the IC chip 11 may be disposed in a projection area of the chip heat sink 12 on the first circuit board 1.

In an embodiment of this disclosure, there may be two or more I/O modules 21 installed on the second circuit board 2. Because the monitoring module 22 extends and combines low-speed signals transmitted between the IC chip 11 and a plurality of I/O modules, the IC chip 11 does not need to be connected to a plurality of I/O modules 21 in a one-to-one correspondence. In this way, a quantity of lines that connect the first circuit board 1 and the second circuit board 2 is reduced. When a speed and quality requirement for transmitting a low-speed signal between the IC chip 11 and the I/O module 21 are met, one low-speed cable 3 may be set. However, if a speed and quality requirement for transmitting a low-speed signal between the IC chip 11 and the I/O module 21 are relatively high, two or more low-speed cables 3 may be disposed. However, a quantity of the low-speed cables 3 is less than a quantity of the I/O modules 21.

Referring to FIG. 5, in an embodiment of this disclosure, a first low-speed connector 14 may be installed on the first circuit board 1, a second low-speed connector 24 may be installed on the second circuit board 2, and the first low-speed connector 14 is connected to the second low-speed connector 24 by using the low-speed cable 3, and the first low-speed connector 14 is connected to the IC chip 11 by using an intra-board cable, and the second low-speed connector 24 is connected to the monitoring module 22 by using an intra-board cable. The monitoring module 22 and the I/O module 21 are connected through an intra-board cable.

In an embodiment, the monitoring module 22 may be an integrated circuit operating according to a non-fixed instruction or an integrated circuit operating according to a fixed instruction. For example, the monitoring module may be a CPLD (complex programmable logic device, complex programmable logic device) chip.

The I/O module 21 may transmit the low-speed signal to the intra-board cable by the signal pin 213.

The low-speed cable is configured to transmit a low-speed signal.

In an embodiment, the low-speed cable may be an I2C bus.

In an embodiment, the intra-board cable may be an intra-board I2C bus.

In an embodiment of this disclosure, the high-speed cable 4 is located outside the first circuit board 1 and the second circuit board 2, and is different from an internal cabling of the first circuit board 1 and an internal cabling of the second circuit board.

In an embodiment of this disclosure, a low-speed signal transmitted between the IC chip and the I/O module may include a monitoring-type signal, and the monitoring-type signal includes a monitoring-type signal sent by the IC chip to the I/O module, for example, a reset signal, a low power mode setting signal, an enabling signal, or the like.

The monitoring-type signal may alternatively include a monitoring-type signal sent by the I/O module to the IC chip, for example, an optical module in-position signal, an optical module error report signaling, an interrupt signal of an optical module, or the like.

The low-speed signal transmitted between the IC chip and the I/O module may further include management service data.

In an embodiment of this disclosure, the I/O module is configured to connect to and receive a content optical module (not shown), and the optical module is configured to convert a received optical signal into an electrical signal. The low-speed signal or the high-speed signal transmitted between the I/O module and the IC chip is actually a high-speed signal or a low-speed signal transmitted between the optical module and the IC chip by using the I/O module. The electrical energy supplied to the I/O module is provided to the optical module. A signal transmitted between the optical module and the IC chip by using the I/O module is an electrical signal. Specifically, the I/O module may be set to a cage structure, and the optical module is inserted into the cage.

Figure 4:
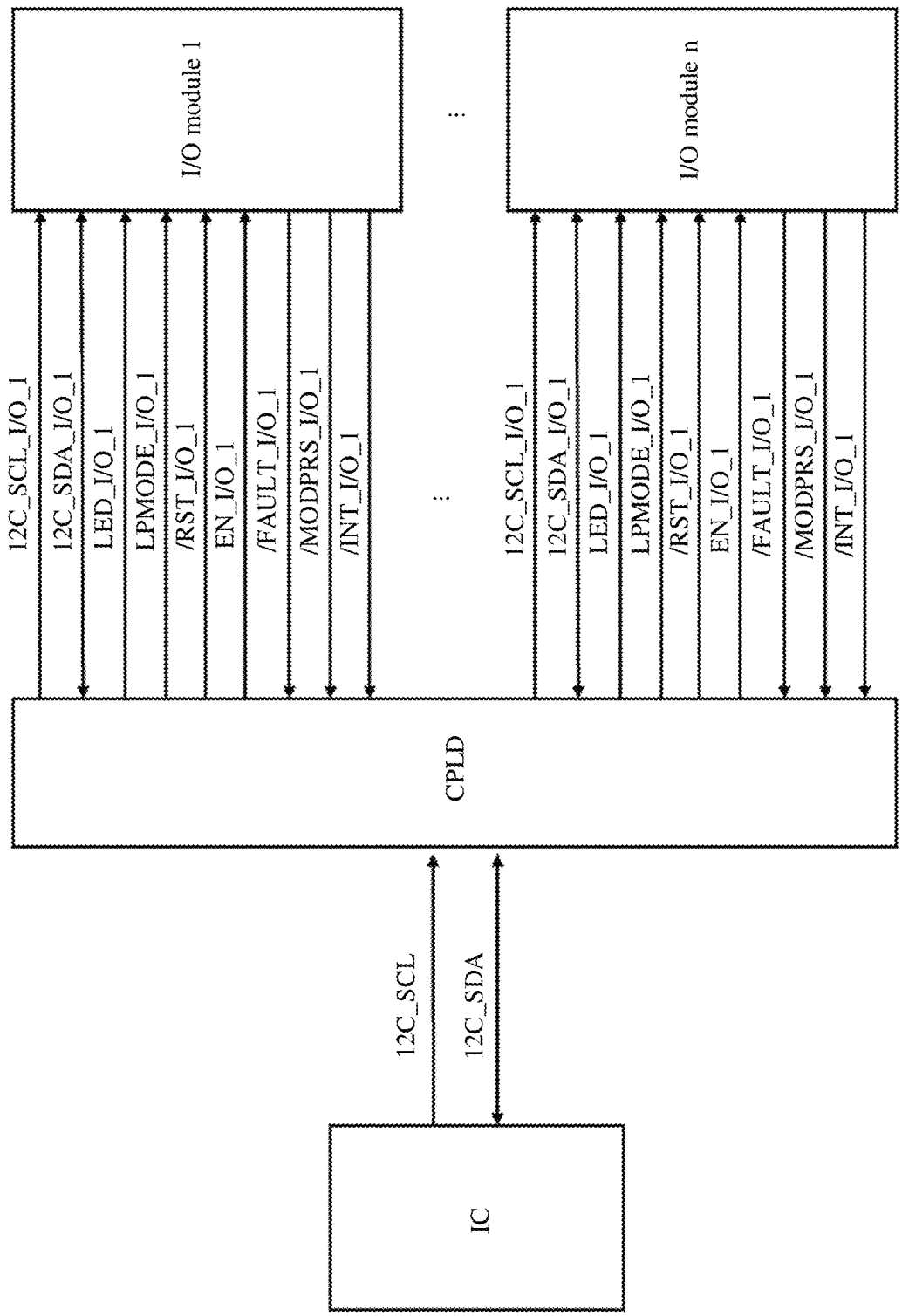
FIG. 4 is a schematic diagram of a low-speed signal exchanged between an I/O module and an IC chip in the embodiment of a circuit board assembly in this disclosure.

Referring to FIG. 4, various low-speed signals interacted between the IC chip, the CPLD chip, and the I/O module are specifically listed in FIG. 4, where n is a natural number. The signals of the LPMODE, /RST, EN, /FAULT, /MODPRS, and /INT required for managing the I/O module and the LED signals of the I/O module can all be provided through the CPLD chip.

A circuit board assembly loaded with a 400 G optical module is used as an example. For various low-speed signals exchanged between the IC chip and the I/O module (or the optical module), refer to the standard QSFP-DD Hardware Rev 3.0. QSFP-DD MSA QSFP-DD Hardware Specification for QSFP DOUBLE DENSITY 8× PLUGGABLE TRANSCEIVER, for explanations of each low-speed signal, refer to definitions of pin matching (pinmap) in pages 11, 12, and 13.

The signal transmitted by each pin of the optical module forms various low-speed signals of interaction between the IC chip and the I/O module (or the optical module). In this disclosure, for specific definitions of various high-speed signals and low-speed signals interacted between the IC chip and the I/O module (or the optical module), not only refer to a current version of the standard, but also refer to a subsequent version of the standard.

An example in which the I/O module is used as a QSFP-DD (Quad Small Form-factor Pluggable Double Density) module is used. Low-speed signals such as a monitoring signal and an indicator signal of the QSFP-DD module are transmitted to the CPLD chip by using an electrical signal in the second circuit board 2, and are transmitted to the IC chip by using the CPLD chip and the low-speed cable.

Referring to FIG. 5, in an embodiment of the foregoing circuit board assembly of this disclosure, it further includes one or more power cables 5, which are connected between the first circuit board 1 and the second circuit board 2, which is configured to output the electric energy in the intra-board power cable of the first circuit board to the intra-board power cable of the second circuit board, so that a plurality of I/O modules 21 obtain the electric energy from the intra-board power cable of the second circuit board.

In an embodiment of the circuit board assembly in this disclosure, a first power connector 15 is installed on the first circuit board 1, a second power connector 25 is installed on the second circuit board 2, and the power cable 5 is connected to the first power connector 15 and the second power connector 25, the first power connector 15 is connected to an intra-board power cable inside the first circuit board 1, and the second power connector 25 is connected to an intra-board power cable of the second circuit board 2.

The quantity of the power cable 5 may be one, if there are a relatively large quantity of I/O modules 21 or a relatively large quantity of required power cables, two or more power cables may be disposed.

The power supply cable may be disposed in a layer of conductive layer of the first circuit board 1, for example, all conducting wires in the entire conducting layer are used to transmit electric energy. The conducting layer may be a copper layer. Similar to the first circuit board 1, the power supply wiring may also be disposed in a layer of conductive layer of the second circuit board 2.

Specifically, the supply voltage provided by the first circuit board 1 for the second circuit board 2 through the power cable 5 may be 48 V, or may be 12 V. Using the QSFP-DD module as an example of the I/O module, the supply voltage provided by the second circuit board 2 for the QSFP-DD module is generally 3.3 V.

Figure 8:
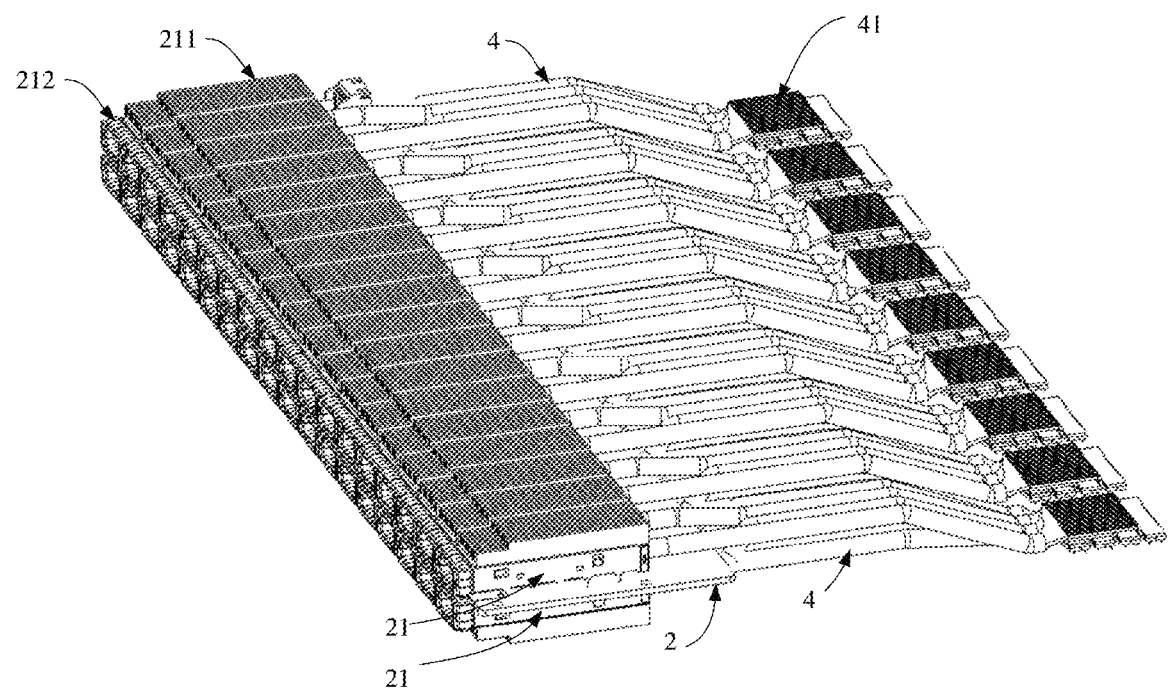
FIG. 8 is a schematic structural diagram of an I/O module and a high-speed cable according to an embodiment of a circuit board assembly in this disclosure.

Referring to FIG. 8, in the foregoing embodiment of this disclosure, the I/O module 21 may be installed on the second circuit board 2 in a crimping manner, and the I/O modules 21 may be connected to both front and rear sides of the second circuit board 2 in a crimping manner, to improve layout density of the I/O modules 21. When the I/O module 21 is fully disposed at both the front side and the rear side of the second circuit board 2, the second circuit board 2 bears a maximum quantity of I/O modules 21. As shown in the figure, one I/O module 21 may be connected to each of both front and rear sides of a same part of the second circuit board 2 in a crimping manner. In this way, areas in which the I/O modules are connected to both the front and rear sides of the second circuit board 2 in a crimping manner are symmetric. That areas in which the I/O modules 21 are connected to both the front and rear sides of the second circuit board 2 in a crimping manner are symmetric means:

A plane parallel to the front side of the second circuit board 2 is used as a reference plane, a plane parallel to the rear side of the second circuit board 2 is used as a reference plane, or a plane perpendicular to a thickness direction of the second circuit board 2 is used as a reference plane. Projections of areas in which the I/O modules 21 are connected to both the front and rear sides of the same part of the second circuit board 2 in a crimping manner on the reference plane overlap or mostly overlap.

FIG. 8 is an accompanying drawing shows the I/O module uses a QSFP-DD module as an example. A total of 36 QSFP-DD modules are disposed on a positive side and a negative side of the second circuit board 2.

Figure 9:
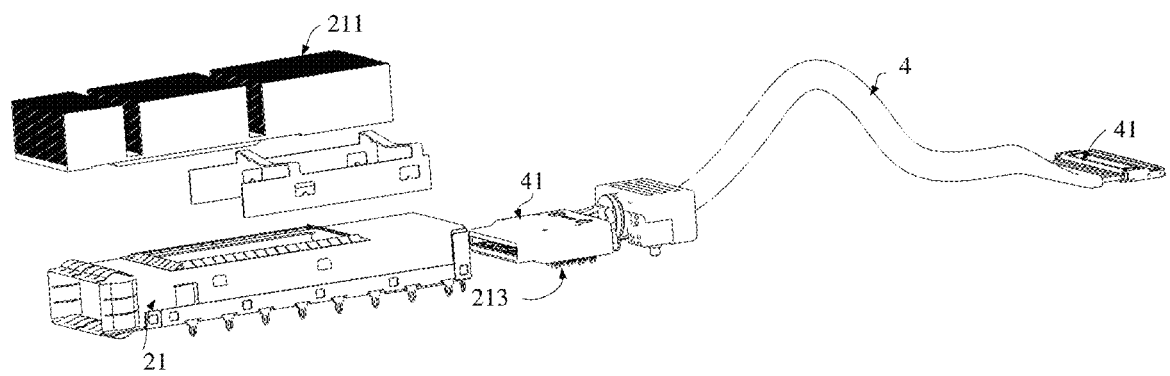
FIG. 9 is a schematic structural exploded view of an I/O module and a high-speed cable according to an embodiment of a circuit board assembly in this disclosure.
Figure 10:
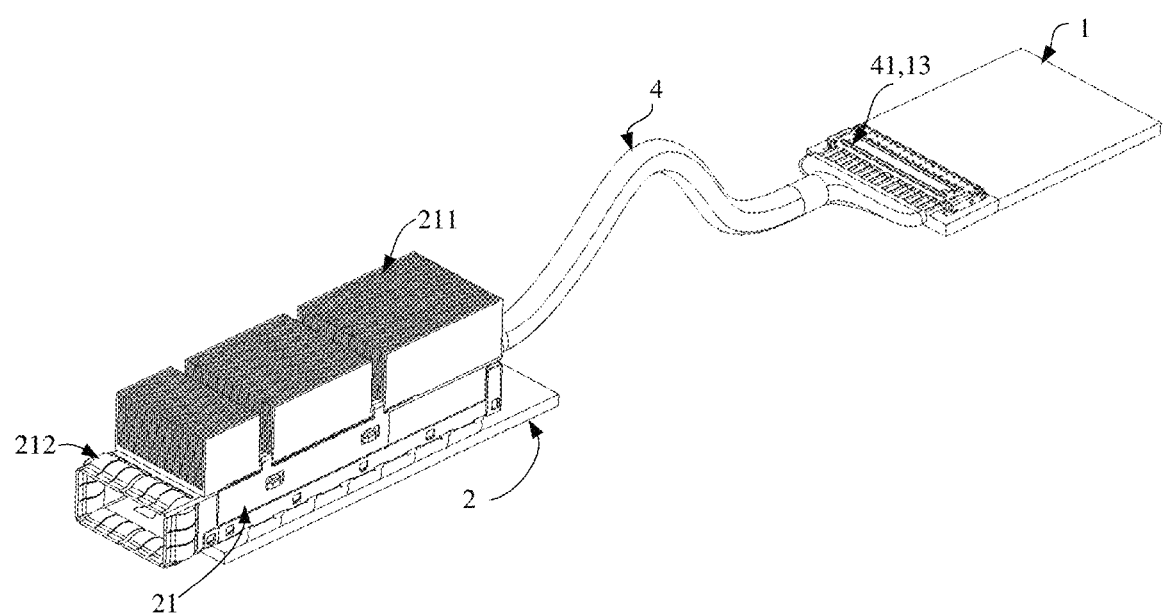
FIG. 10 is a schematic structural diagram of a combination relationship between an I/O module and a high-speed cable according to an embodiment of a circuit board assembly in this disclosure.

As shown in FIG. 9 and FIG. 10, in an embodiment of this disclosure, the cable-side connector 41 is disposed at two ends of the high-speed cable 4, and the cable-side connector 41 at one end is connected to a tail end of the I/O module 21, the cable-side connector 41 on the other end of the high-speed cable 4 cooperates with the high-speed connector 13 of the first circuit board 1. Referring to FIG. 7, the high-speed connectors 13 of the first circuit board 1 are disposed in one column, and cable-side connectors 41 of two high-speed cables 4 connected to two I/O modules 21 that are in the symmetric areas and that are connected to both front and rear sides of the second circuit board 2 in a crimping manner are connected to two adjacent high-speed connectors 13 of the first circuit board 1 in a one-to-one correspondence. For example, when the high-speed connectors 13 of the first circuit board 1 are disposed in one column, if high-speed connectors 13 in odd-numbered positions (for example, a high-speed connector in the first position, a high-speed connector in the third position, and the like) are connected to the I/O module 21 on the front side of the second circuit board 2, high-speed connectors 13 in even-numbered positions (for example, a high-speed connector located in the second position, a high-speed connector in the fourth position, and the like) are connected to the I/O module 21 on the rear side of the second circuit board 2. If the high-speed connectors 13 in the odd-numbered positions are connected to the I/O module 21 on the rear side of the second circuit board 2, the high-speed connectors 13 in the even-numbered positions are connected to the I/O module 21 on the front side of the second circuit board 2.

In an embodiment, the cable-side connector 41 may be a high-speed connector. Referring to FIG. 9, as an example, a signal pin 213 configured to transmit a low-speed signal to an intra-board cable may be integrated with the cable-side connector 41, and the cable-side connector 41 cooperates with the I/O module 21, it may be further interconnected with the optical module in the I/O module 21, where the signal pin 213 is disposed at the bottom of the cable-side connector 41, the signal pin 213 is installed on the surface of the second circuit board 2, and the signal pin is connected to the intra-board cable of the second circuit board. A high-speed signal of the optical module is transmitted by using the cable-side connector 41 and the high-speed cable 4, and a low-speed signal transmitted between the optical module and the monitoring module 22 is transmitted to the intra-board cable by using the signal pin 213.

The signal pin 213 is disposed at the bottom of the cable-side connector 41. The conductive terminals in the cable-side connector 41 include a first group of terminals and a second group of terminals, the first group of terminals are configured to transmit the high-speed signal, the second group of terminals are configured to transmit the low-speed signal, and ends of the first group of terminals are connected to the I/O module 21 or an optical module in the I/O module 21, the other ends of the first group of terminals are connected to a conducting wire in the high-speed cable 4; and ends of the second group of terminals are connected to an optical module in the I/O module 21 or the I/O module 21, and the other ends of the second group of terminals are connected to the signal pin 213. When ends of the first group of terminals are connected to the I/O module 21, the I/O module 21 is connected to an internal optical module, that is, the optical module in the I/O module 21 is connected to the first group of terminals by using the I/O module 21. When ends of the second group of terminals are connected to the I/O module 21, the I/O module 21 is connected to an internal optical module, that is, the optical module in the I/O module 21 is connected to the second group of terminals by using the I/O module 21.

In an embodiment, a manner in which the signal pin 213 is installed on the second circuit board 2 may be that the signal pin 213 is connected to a hole of the second circuit board 2 in a crimping manner or welded (for example, through wave soldering or reflow soldering) to a surface of the second circuit board 2.

In an embodiment, the cable-side connector 41 may cooperate with the I/O module 21 in the following manner: The cable-side connector 41 and the I/O module 21 may be two independent components, and the cable-side connector 41 and the I/O module 21 are assembled or welded together. Alternatively, the cable-side connector 41 and the I/O module 21 may be an integrally formed component.

In an embodiment, a high-speed cable in a flat form is bundled into a cylindrical form. The high-speed cable connected to the I/O module 21 on the front side and the rear side of the second circuit board 2 is disposed in a stacked manner in a height direction. The high-speed cable connected to the I/O module 21 on the front side of the second circuit board 2 is located on the top layer, and the high-speed cable connected to the I/O module 21 on the rear side of the second circuit board 2 is located on the bottom layer. The two high-speed cables connected to the I/O modules 21 that are in symmetric areas and that are connected to both front and rear sides of the second circuit board 2 in a crimping manner are in a group, and the two high-speed cables are in overlapping cabling in a height direction. FIG. 8 is a diagram of an example in which the I/O module uses a QSFP-DD module, and 36 high-speed cables 4 correspond to 18 groups of cables. In this overlapping cabling solution, 50% wind resistance in the board is reduced, and heat dissipation performance of a system is improved, to help heat dissipation of an optical module.

In an embodiment of this disclosure, a quantity of high-speed cables 4 is greater than or equal to a quantity of I/O modules 21, and the high-speed cables 4 may be in a one-to-one correspondence with the I/O modules 21. Alternatively, all or some of the I/O modules 21 are connected to two or more high-speed cables 4. A quantity of the high-speed cables 4 is equal to a quantity of the high-speed connectors 13, and the high-speed cables 4 are in a one-to-one correspondence with the high-speed connectors 13. A quantity of I/O modules 21 installed on the second circuit board 2 may be 2 or more, and correspondingly, a quantity of the high-speed connectors 13 may be 2 or more, and a quantity of the high-speed cables 4 may be 2 or more.

Figure 6:
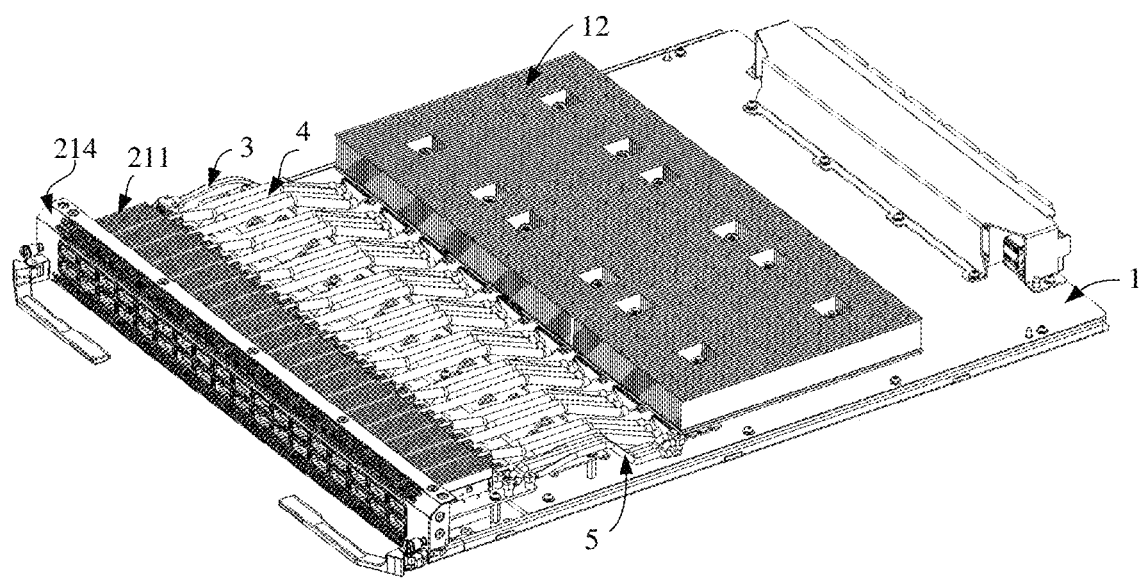
FIG. 6 is a schematic structural diagram of another view angle of the embodiment of a circuit board assembly shown in FIG. 5.
Figure 7:
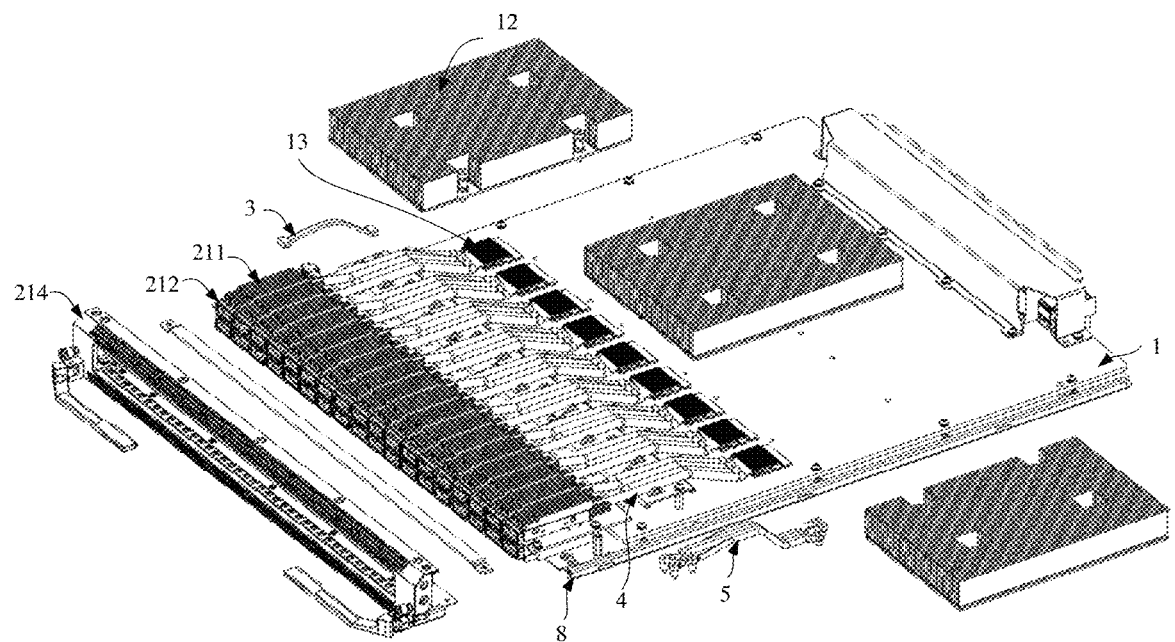
FIG. 7 is a schematic structural diagram of an exploded view of the embodiment of a circuit board assembly shown in FIG. 6.

As shown in FIG. 5 and FIG. 6, on the first circuit board 1, a first low-speed connector 14 connected to the low-speed cable 3 and a first power connector 15 connected to the power cable 5 are located at in edge position of the first circuit board 1. For example, the first low-speed connector 14 and the first power connector 15 are separately located outside the plurality of high-speed cables 4.

As shown in FIG. 5 and FIG. 6, on the second circuit board 2, a second low-speed connector 24 connected to the low-speed cable 3 and a second power connector 25 connected to the power cable 5 are located in an edge position of the second circuit board 2. For example, the second low-speed connector 24 and the second power connector 25 are separately located outside the plurality of high-speed cables 4.

As shown in FIG. 9 and FIG. 10, in a specific embodiment, a height of the cable-side connector 41 interconnected to the high-speed connector 13 is less than or equal to 3.0 mm. If a processing error is considered, a height of the cable-side connector 41 interconnected to the high-speed connector 13 is less than or equal to 3.6 mm.

After the cable-side connector 41 cooperates with the high-speed connector 13 of the first circuit board 1, a total height including a high-speed cable does not exceed 3.0 mm and is less than or equal to a height of the IC chip 11, and may be disposed below the chip heat sink 12. If a processing error is considered, a total height of the cable-side connector 41 after fitting with the high-speed connector 13 is less than or equal to 3.6 mm.

As shown in FIG. 2, in another embodiment, the high-speed connector 13 of the first circuit board 1 may alternatively be disposed on a rear side of the first circuit board 1, namely, a surface opposite to a side on which the IC chip 11 is located (which may be understood that the IC chip 11 is installed on a front side of the first circuit board 1, and the high-speed connector 13 is installed on a rear side of the first circuit board 1). A plane parallel to a front side of the first circuit board 1 is used as a reference plane, a plane parallel to the rear side of the first circuit board 1 is used as a reference plane, or a plane perpendicular to a thickness direction of the first circuit board 1 is used as a reference plane. A projection of the high-speed connector 13 on the reference plane partially or completely falls within a projection of the chip heat sink 12 on the reference plane.

After the cable-side connector 41 on the high-speed cable 4 cooperates with the high-speed connector 13 on the first circuit board 1, the high-speed cable 4 is located on a rear side of the first circuit board 1. Because the high-speed connector 13 is disposed at a location close to the IC chip 11, an intra-board cable distance between the high-speed connector 13 and the IC chip 11 may be shortened as much as possible. In this way, an insertion loss of a high-speed signal may also be reduced.

Still referring to FIG. 2, in another embodiment, the high-speed connector 13 may be installed on both front and rear sides of the first circuit board 1, a part or an entirety of the high-speed connector 13 located on the front side of the first circuit board 1 is disposed in a projection area of the chip heat sink 12 on the first circuit board 1, and a projection of the high-speed connector 13 located on a rear side of the first circuit board 1 on the reference plane, a part or an entirety of the chip heat sink 12 falls within a projection of the chip heat sink 12 on the reference plane. Specifically, a projection of the high-speed connector 13 on the reference plane on the front side of the first circuit board 1 and a projection of the high-speed connector 13 on the reference plane on the rear side of the first circuit board 1 may partially or completely overlap each other.

As shown in FIG. 2, a cable-side connector 41 of a high-speed cable 4 connected to the I/O module 21 installed on the front side of the second circuit board 2 is correspondingly connected to the high-speed connector 13 on the front side of the first circuit board 1. The cable-side connector 41 of the high-speed cable 4 connected to the I/O module 21 on the rear side of the second circuit board 2 is correspondingly connected to the high-speed connector 13 on the rear side of the first circuit board 1.

As shown in FIG. 7, a heat sink 211 may be disposed at the top of the I/O module 21. An edge of the second circuit board 2 close to the I/O module 21 may be spliced into a port panel 214, and the port panel 214 is configured to protect the I/O module. A heat dissipation panel 212 is disposed at an edge of the opening of the I/O module 21. The heat dissipation panel 212 is configured to dissipate heat for the I/O module 21. A structure and a material of the heat dissipation panel 212 are not limited, and may be an aluminum plate, a copper plate, a heat pipe, a VC baseplate, or the like.

Figure 11:
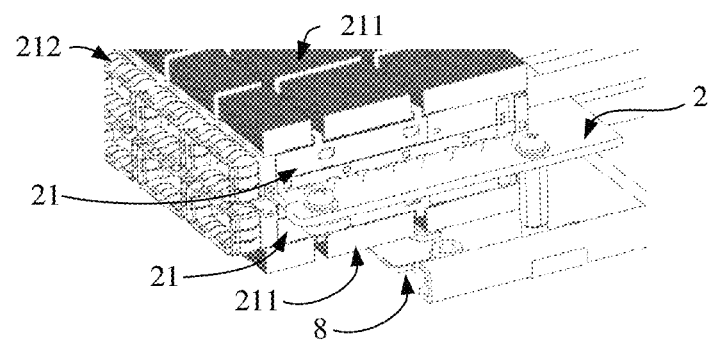
FIG. 11 is a schematic structural diagram of a combination relationship between a second circuit board and a baseplate according to an embodiment of a circuit board assembly in this disclosure.

As shown in FIG. 11, in an embodiment of this disclosure, the circuit board assembly may further include a baseplate 8, and the first circuit board 1 and the second circuit board 2 are installed on a same side surface of the baseplate 8. Specifically, the first circuit board 1 and the second circuit board 2 are fastened on the baseplate 8 by using screws, stud or self-clinching nut, and a structure form of the baseplate 8 is not limited, and may be a subrack board supporting structure, or may be a box body.

As shown in FIG. 5, in an embodiment of this disclosure, the circuit board assembly may further include a cable bracket 9. The cable bracket 9 is installed on the first circuit board 1 or the baseplate 8. The cable bracket 9 is configured to mount or fasten the high-speed cable 4.

In an embodiment of this disclosure, the first circuit board 1 may be a high-speed circuit board, and the second circuit board 2 may be a low-speed circuit board. The high-speed circuit board and the low-speed circuit board are relative. The high-speed circuit board and the low-speed circuit board transmission signals at different rates, the transmitted signals at a higher rate are a high-speed circuit board, and the transmitted signals at a lower rate are low-speed circuit boards. Specifically, the first circuit board 1 may be a PCB (Printed Circuit Board) board, and the second circuit board may also be a PCB board.

In an embodiment of this disclosure, the one high-speed cable includes one or more multi-core cables. The low-speed cable includes one or more multi-core cables. The one power cable includes one or more multi-core cables.

In the foregoing embodiments of this disclosure, the high-speed signal generally refers to a signal with a single-channel transmission rate greater than or equal to 1 Gbps. For example, a single-channel transmission rate is 25 Gbps, 28 Gbps, 56 Gbps or 112 Gbps signals. The low-speed signal refers to a signal with a single-channel transmission rate less than 1 Gbps. For the distinction between high-speed signals and low-speed signals, please refer to the standard: QSFP-DD Hardware Rev 3.0: Related definitions in QSFP-DD MSA QSFP-DD Hardware Specification for QSFP DOUBLE DENSITY 8× PLUGGABLE TRANSCEIVER. For related definitions of a high-speed signal and a low-speed signal in this disclosure, reference may be made not only to the current version of the standard, but also to subsequent versions of the standard.

In the foregoing embodiments of this disclosure, the IC chip may be a switching chip, a CPU chip, a GPU chip, or the like. The I/O module may be a QSFP28 (Quad Small Form-factor Pluggable, where 28 represents that a highest port rate is 28 Gbps) module, a QSFP-DD module, an SFP-DD (Small Form-factor Pluggable Double Density) module, an optical module cage such as an OSFP (Octal Small Form factor Pluggable) module or a CFP (Centum Form factor Pluggable) module. The transmission rate of the high-speed cable may be 56 Gbps or 112 Gbps. For example, the circuit board assembly can be applied in an IC chip 56 Gbps SerDes (SERializer/DESerializer, SERializer/DESerializer) scenario or a 112 Gbps SerDes scenario. It should be noted that rates of transmitting signals among the high-speed cable, the first circuit board 1, the high-speed connector 13, the IC chip 11, the second circuit board 2, and the I/O module 21 match each other. In other words, if the I/O module 21 and the IC chip 11 transmit a signal at a rate of 56 Gbps, on a transmission channel including the high-speed cable, the first circuit board 1, the high-speed connector 13, the IC chip 11, the second circuit board 2, the I/O module 21, and the like, each component supports to transmit a signal at a rate of 56 Gbps.

Figure 12:
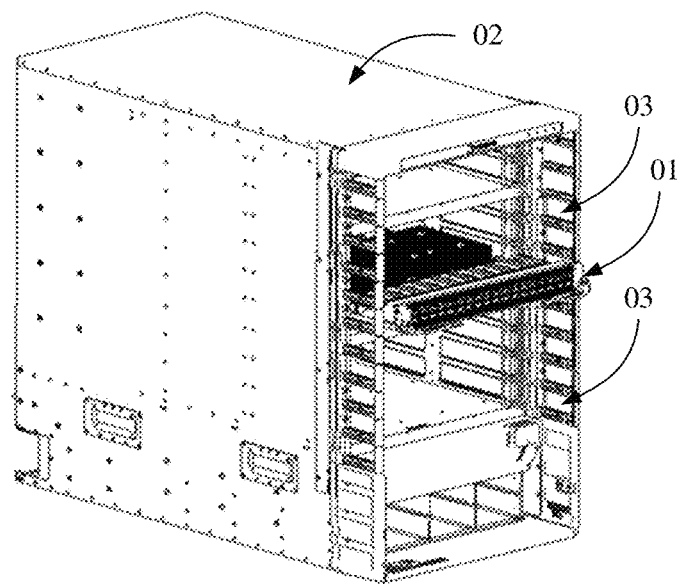
FIG. 12 is a schematic structural diagram of an electronic device embodiment in this disclosure.

As shown in FIG. 12, this disclosure further provides an embodiment of an electronic device. The electronic device includes a housing 02, a heat dissipation apparatus (not shown), and a plurality of circuit board assemblies 01. The circuit board assembly 01 is installed inside the housing 02, the heat dissipation apparatus is configured to dissipate heat for the circuit board assembly 01. The circuit board assembly 01 may use various embodiments of the circuit board assembly described in the foregoing embodiments.

In an embodiment, a slot 03 configured to mount the circuit board assembly 01 is disposed inside the housing 02, where the slot 03 is accommodation space provided for the circuit board assembly 01, a guide rail is generally disposed, and a connector connected to the circuit board assembly 01 is generally disposed, the guide rail may be disposed on an inner wall of the housing 02 of the electronic device. The bottom plate or the edge of the first circuit board or the second circuit board in the circuit board assembly 01 is disposed on the guide rail, so that the circuit board assembly 01 can slide on the guide rail like the drawer. In this way, when the circuit board assembly 01 is loaded, the circuit board assembly 01 is pushed inside the housing 02 to interconnect with the connector, and when the circuit board assembly 01 needs to be unloaded, the circuit board assembly 01 is then pulled out. It should be noted that, to display the slot 03, only one circuit board assembly 01 is installed in the electronic device shown in FIG. 12. Actually, according to a service requirement, the circuit board assembly 01 may be installed in all slots 03 in the electronic device.

The electronic device may be a switch or a router.

In the descriptions of this disclosure, it should be noted that the terms "first" and "second" are merely intended for a purpose of description, and shall not be understood as an indication or implication of relative importance or implicit indication of a quantity of indicated technical features. Therefore, a feature limited by "first" or "second" may explicitly or implicitly include one or more such features.

In the description of this disclosure, it should be noted that, unless otherwise specified or limited, terms "installation", "link", and "connection" shall be understood in a broad sense, for example, may be a fixed connection, a detachable connection, or an integrated connection. It can be directly connected or indirectly connected through an intermediate medium, and it can be an internal connection of the two components. An ordinary technician in the art may understand specific meanings of the foregoing terms in this disclosure based on a specific situation.

In the descriptions of the specification of this disclosure, the described specific features, structures, materials or characteristics may be combined in a proper manner in any one or more of the embodiments or examples.

In the descriptions of this disclosure, it should be understood that "-" and "~" represent a range between two values, and the range includes endpoints. For example, "A-B" indicates a range greater than or equal to A and less than or equal to B. "A~B" indicates a range greater than or equal to A and less than or equal to B.

In this disclosure, "at least one" means one or more, and "a plurality of" means two or more. The term "and/or" describes an association relationship for describing associated objects and represents that three relationships may exist. For example, A and/or B may represent the following: A exists independently, A and B exist simultaneously, and B exists independently, where A, B may be a singular or a plural number. The character "/" generally indicates an "or" relationship between the associated objects. "At least one of the following items (pieces)" or a similar expression thereof means any combination of these items, including any combination of singular items (pieces) or plural items (pieces). For example, at least one item (piece) of a, b, and c may represent: a, b, c, a combination of a and b, a combination of a and c, a combination of b and c, and a combination of a, b, and c, where a, b, c may be single a, b, c or a plurality of pieces of a, b, and c.

In the descriptions of this disclosure, it needs to be understood that a direction or a position relationship indicated by terms such as "center", "upper", "lower", "front", "rear", "left", "right", "vertical", "horizontal", "top", "bottom", "inside", "outside", "front side", "rear side", and the like are based on the directions or position relationships shown in the accompanying drawings, and they are merely used to describe this disclosure and simplify the descriptions, instead of intending to specify or imply that an indicated apparatus or component needs to be constructed or operate in a specific direction, and therefore such terms cannot be understood as a limitation on this disclosure.

The invention claimed is:

1. A circuit board assembly, comprising a first circuit board, a second circuit board, one or more low-speed cables, a plurality of high-speed cables, an integrated circuit (IC) chip, a chip heat sink, a plurality of high-speed connectors, a plurality of input/output (I/O) modules, and a monitoring module, wherein the IC chip, and the high-speed connectors are installed on the first circuit board, the plurality of I/O modules and the monitoring module are installed on the second circuit board, the IC chip is connected to the monitoring module by using the low-speed cable, and the monitoring module is connected to the plurality of I/O modules by using an intra-board cable;

the monitoring module is configured to: extend one low-speed signal received from the low-speed cable into a plurality of low-speed signals, and correspondingly send the plurality of low-speed signals to the plurality of I/O modules; and is configured to: combine the plurality of low-speed signals from the plurality of I/O modules, and then send the combined low-speed signals to the IC chip by using the low-speed cable;

each I/O module is connected to a corresponding high-speed connector of the first circuit board by using one or more high-speed cables, the corresponging high-speed connector is connected to the IC chip by using an intra-board cable of the first circuit board, the chip heat sink is attached to a surface of the IC chip, the corresponging high-speed connector of the first circuit board is disposed on a rear side of the first circuit board, the rear side of the first circuit board is a side opposite to a side on which the IC chip is located;

a plane parallel to a front side of the first circuit board is used as a first reference plane, a plane parallel to a rear side of the first circuit board is used as a second reference plane, or a plane perpendicular to a thickness direction of the first circuit board is used as a third reference plane; and a projection of the corresponging high-speed connector on at least one of the reference planes partially or completely falls within a projection of the chip heat sink on at least one of the reference planes.

2. The circuit board assembly of claim 1, wherein the circuit board assembly further comprises a low-speed connector, the low-speed connector is installed on the first circuit board, and the low-speed connector is connected to the IC chip by using another intra-board cable of the first circuit board.

3. The circuit board assembly of claim 1, wherein the one low-speed signal includes a reset signal, a low power mode setting signal, an enabling signal, an optical module in-position signal, an optical module error reporting signal, and/or an interrupt signal of an optical module.

4. The circuit board assembly of claim 1, wherein the one low-speed signal includes management service data.

5. The circuit board assembly of claim 1, wherein a cable-side connector is disposed at an end of each high-speed cable, and the cable-side connectors cooperate with respective ones of the high-speed connectors.

6. An electronic device, comprising a housing, a heat dissipation apparatus, and a plurality of circuit board assemblies, wherein the circuit board assemblies are installed inside the housing, and the heat dissipation apparatus is configured to dissipate heat for the circuit board assemblies;
wherein each circuit board assembly comprises a first circuit board, a second circuit board, one or more low-speed cables, a plurality of high-speed cables, an integrated circuit (IC) chip, a chip heat sink, a plurality of high-speed connectors, a plurality of input/output (I/O) modules, and a monitoring module, wherein the IC chip, and the high-speed connectors are installed on the first circuit board, the plurality of I/O modules and the monitoring module are installed on the second circuit board, the IC chip is connected to the monitoring module by using the low-speed cable, and the monitoring module is connected to the plurality of I/O modules by using an intra-board cable;
the monitoring module is configured to: extend one low-speed signal received from the low-speed cable into a plurality of low-speed signals, and correspondingly send the plurality of low-speed signals to the plurality of I/O modules; and is configured to: combine the plurality of low-speed signals from the plurality of I/O modules, and then send the combined low-speed signals to the IC chip by using the low-speed cable;
each I/O module is connected to a corresponding high-speed connector of the first circuit board by using one or more high-speed cables, the corresponging high-speed connector is connected to the IC chip by using an intra-board cable of the first circuit board, the chip heat sink is attached to a surface of the IC chip, the corresponging high-speed connector of the first circuit board is disposed on a rear side of the first circuit board, the rear side of the first circuit board is a side opposite to a side on which the IC chip is located;
a plane parallel to a front side of the first circuit board is used as a first reference plane, a plane parallel to a rear side of the first circuit board is used as a second reference plane, or a plane perpendicular to a thickness direction of the first circuit board is used as a third reference plane; and a projection of the corresponging high-speed connector on at least one of the reference planes partially or completely falls within a projection of the chip heat sink on at least one of the reference planes.

7. The electronic device of claim 6, wherein the circuit board assembly further comprises a low-speed connector, the low-speed connector is installed on the first circuit board, and the low-speed connector is connected to the IC chip by using another intra-board cable of the first circuit board.

8. The electronic device of claim 6, wherein the one low-speed signal includes a reset signal, a low power mode setting signal, an enabling signal, an optical module in-position signal, an optical module error reporting signal, and/or an interrupt signal of an optical module.

9. The electronic device of claim 6, wherein the one low-speed signal includes management service data.

10. The electronic device of claim 6, wherein a cable-side connector is disposed at an end of each high-speed cable, and the cable-side connectors cooperate with respective ones of the high-speed connectors.

* * * * *

UNITED STATES PATENT AND TRADEMARK OFFICE
CERTIFICATE OF CORRECTION

PATENT NO.          : 12,058,803 B2
APPLICATION NO.     : 18/372828
DATED               : August 6, 2024
INVENTOR(S)         : Chaojun Deng et al.

It is certified that error appears in the above-identified patent and that said Letters Patent is hereby corrected as shown below:

In the Claims

In Claim 1, Column 18, Lines 60-61, delete "corresponging high-speed connector" and insert --corresponding high-speed--.

In Claim 1, Column 18, Line 64, delete "corresponging high-speed connector" and insert --corresponding high speed- --.

In Claim 6, Column 20, Line 11, delete "corresponging" and insert --corresponding--.

In Claim 6, Column 20, Line 24, delete "a projection of the corresponging high-speed" and insert --a projection of the high-speed--.

Signed and Sealed this
Fifth Day of November, 2024

Katherine Kelly Vidal
*Director of the United States Patent and Trademark Office*